US010651821B2

(12) United States Patent
Kido

(10) Patent No.: US 10,651,821 B2
(45) Date of Patent: May 12, 2020

(54) MULTIPLEXER, HIGH-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Syunsuke Kido, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/243,158

(22) Filed: Jan. 9, 2019

(65) Prior Publication Data

US 2019/0149131 A1   May 16, 2019

Related U.S. Application Data

(63) Continuation of application No. PCT/JP2017/028274, filed on Aug. 3, 2017.

(30) Foreign Application Priority Data

Aug. 9, 2016 (JP) .................. 2016-157051

(51) Int. Cl.
*H03H 9/64* (2006.01)
*H04B 1/18* (2006.01)
(Continued)

(52) U.S. Cl.
CPC .......... *H03H 9/6489* (2013.01); *H03H 9/145* (2013.01); *H03H 9/25* (2013.01); *H03H 9/542* (2013.01); *H03H 9/547* (2013.01); *H03H 9/568* (2013.01); *H03H 9/605* (2013.01); *H03H 9/6409* (2013.01); *H03H 9/6483* (2013.01); *H03H 9/6496* (2013.01);
(Continued)

(58) Field of Classification Search
CPC .. H03H 9/145; H03H 9/14541; H03H 9/6406; H03H 9/6483; H03H 9/6496; H03H 9/706; H03H 9/725; H03H 9/542; H03H 9/547; H03H 9/6436; H03H 9/6489
USPC ........................................ 455/338
See application file for complete search history.

(56) References Cited

U.S. PATENT DOCUMENTS

| 2011/0090026 A1 | 4/2011 | Nakahashi et al. |
| 2014/0113580 A1* | 4/2014 | Yamazaki ............ H03H 9/6483 |
| | | 455/307 |

FOREIGN PATENT DOCUMENTS

| JP | 2001-308676 A | 11/2001 |
| JP | 2004-088143 A | 3/2004 |

(Continued)

OTHER PUBLICATIONS

Official Communication issued in International Patent Application No. PCT/JP2017/028274, dated Oct. 24, 2017.

*Primary Examiner* — Shaima Q Aminzay
(74) *Attorney, Agent, or Firm* — Keating & Bennett, LLP

(57) ABSTRACT

A multiplexer includes a first filter on a first path connecting a common terminal and a first terminal and defined by a band pass filter, a low pass filter, or a high pass filter, and a second resonator on a second path connecting the common terminal and a second terminal and defined by a band elimination filter including at least one elastic wave resonator. A pass band of the first filter and an attenuation band of the second filter overlap with each other, and a ripple of a first resonator closest to the common terminal is generated only outside pass bands of the first filter and the second filter.

18 Claims, 8 Drawing Sheets

(51) Int. Cl.
*H03H 9/54* (2006.01)
*H03H 9/70* (2006.01)
*H04B 1/00* (2006.01)
*H03H 9/60* (2006.01)
*H03H 9/56* (2006.01)
*H03H 9/145* (2006.01)
*H03H 9/25* (2006.01)
*H03H 9/72* (2006.01)

(52) U.S. Cl.
CPC ............ *H03H 9/706* (2013.01); *H03H 9/725* (2013.01); *H04B 1/0057* (2013.01); *H04B 1/18* (2013.01)

(56) References Cited

FOREIGN PATENT DOCUMENTS

| JP | 2005-295203 A | 10/2005 |
| WO | 2010/001522 A1 | 1/2010 |
| WO | 2012/176508 A1 | 12/2012 |

* cited by examiner

MULTIPLEXER, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-157051 filed on Aug. 9, 2016 and is a Continuation Application of PCT Application No. PCT/JP2017/028274 filed on Aug. 3, 2017. The entire contents of each application are hereby incorporated herein by reference.

BACKGROUND OF THE INVENTION

1. Field of the Invention

The present invention relates to a multiplexer, a high-frequency front-end circuit, and a communication apparatus.

2. Description of the Related Art

Recently, it is required for a cellular phone to be compatible with so-called "CA (carrier aggregation)" of simultaneous transmission and reception by a single terminal using a plurality of frequency bands and a plurality of radio systems. In order to meet this requirement, a multiplexer (splitter) for splitting high frequency signals having a plurality of radio carrier frequencies is arranged directly under one antenna. The multiplexer includes a plurality of band pass filters. As the plurality of band pass filters, for example, elastic wave filters that have filter characteristics such as low loss properties in pass bands and steep bandpass characteristics in the vicinity of the pass bands, and are configured by elastic wave resonators, or the like are used.

Japanese Unexamined Patent Application Publication No. 2004-88143 discloses a technique related to such a multiplexer.

However, the multiplexer described in Japanese Unexamined Patent Application Publication No. 2004-88143 has a problem in that the bandpass characteristics in the pass band of one filter of the plurality of band pass filters are deteriorated by being influenced by the other band pass filters in CA. Specifically, in addition to main modes for realizing the above-described filter characteristics, unwanted modes are simultaneously generated in the elastic wave resonators of the other band pass filters. Examples of the unwanted modes include an SV (Shear Vertical) wave, a bulk elastic wave, transverse modes, a stop band, high-order modes, and the like when an SH (Shear Horizontal) wave of a SAW (Surface Acoustic Wave) is the main mode. When the elastic wave resonators are BAW (Bulk Acoustic Wave) resonators or FBAR (Film Bulk Acoustic Resonator) resonators, unwanted modes with planar shapes or three-dimensional shapes of these resonators are generated. When the unwanted modes are generated in the elastic wave resonators, ripples which are phenomena that impedance characteristics of the elastic wave resonators change locally at specific frequencies are generated. If the frequencies at which the ripples are generated and the pass band of the one filter overlap with each other, the bandpass characteristics in the pass band may be deteriorated.

SUMMARY OF THE INVENTION

Accordingly, preferred embodiments of the present invention provide multiplexers, high-frequency front-end circuits, and communication apparatuses that each reduce or prevent reduce or prevent deterioration in bandpass characteristics due to a ripple.

A multiplexer according to a preferred embodiment of the present invention includes a first filter that is provided on a first path connecting a common terminal and a first terminal and is any one of a band pass filter (hereinafter, also referred to as a BPF), a low pass filter (hereinafter, also referred to as an LPF), and a high pass filter (hereinafter, also referred to as an HPF), and a second filter that is provided on a second path connecting the common terminal and a second terminal and is a band elimination filter (hereinafter, also referred to as a BEF) including at least one elastic wave resonator, wherein a pass band of the first filter and an attenuation band of the second filter overlap with each other, and a ripple of a first resonator located at a position closest to the common terminal among the at least one elastic wave resonator is generated only outside pass bands of the first filter and the second filter.

When the at least one elastic wave resonator includes a plurality of elastic wave resonators, the first resonator among the plurality of elastic wave resonators is located at the position closest to the common terminal, and is thus most likely to influence the first filter. In other words, the first resonator is directly connected to the first filter with the common terminal interposed therebetween, so that the first resonator is most likely to influence the first filter. Therefore, when a frequency at which the ripple of the first resonator is generated is present in the pass band of the first filter, the ripple of the first resonator influences bandpass characteristics of the first filter and the bandpass characteristics are deteriorated. When the frequency at which the ripple of the first resonator is generated is present in the pass band of the second filter (that is, a band in which attenuation is not made by the BEF), the ripple of the first resonator influences bandpass characteristics of the second filter and the bandpass characteristics are deteriorated. To cope with these points, with the multiplexer in this aspect, since the ripple of the first resonator is generated only outside the pass bands of the first filter and the second filter, it is possible to reduce or prevent the deterioration in the bandpass characteristics due to the ripple.

In addition, the at least one elastic wave resonator may be a plurality of elastic wave resonators including the first resonator and a second resonator.

With this configuration, the attenuation band of the second filter is able to be widened. In other words, the pass band of the first filter, which overlaps with the attenuation band of the second filter, is able to be widened.

Further, a ripple of the second resonator may be generated in the pass band of the first filter.

With this configuration, even if the ripple of the second resonator is generated in the pass band of the first filter due to design, influences that may be imparted to the first filter by the ripple of the second resonator are attenuated by attenuation characteristics of the first resonator which is located at the position closest to the common terminal. Therefore, the influences hardly impact the bandpass characteristics of the first filter, and deterioration in the bandpass characteristics in the pass band of the first filter due to the ripple of the second resonator is able to be reduced or prevented. Further, it is not necessary to design the second filter such that the ripple of the second resonator is generated outside the pass band of the first filter, thus making it easy to design the second filter.

In addition, the first resonator and the second resonator may be series resonators provided on the second path.

With this configuration, the second filter can function as a BEF having an HPF function.

Further, the first resonator and the second resonator may be parallel resonators provided on paths connecting the second path and ground.

As a result, the second filter is able to function as a BEF having an LPF function.

Further, an attenuation pole of the first resonator may be located at a lower frequency side than an attenuation pole of the second resonator.

A ripple is able to be generated at any location in impedance characteristics of a resonator. For example, in a resonator designed with a specific design parameter, a ripple is generated at the lower frequency side than an anti-resonant frequency, and in a resonator designed with another design parameter, a ripple is generated at the higher frequency side than an anti-resonant frequency.

When a BEF includes series resonators, anti-resonant frequencies at which impedances of the series resonators become maximum are attenuation poles of the BEF. When the ripples are generated at the lower frequency side than the anti-resonant frequencies, the anti-resonant frequency of the first resonator is the lowest among the anti-resonant frequencies of the first resonator and the second resonator which are the series resonators and the low frequency side in the attenuation band of the second filter is defined by the anti-resonance point of the first resonator. Therefore, the ripple of the first resonator is generated in a lower frequency band than the attenuation band of the second filter, so that the ripple of the first resonator is generated in a lower frequency band than the pass band of the first filter, which overlaps with the attenuation band of the second filter, thus reducing or preventing deterioration in the bandpass characteristics due to the ripple.

On the other hand, when the BEF includes the parallel resonators, if the ripples are generated at the lower frequency side than resonant frequencies at which impedances of the parallel resonators become minimum and which are attenuation poles of the BEF, the resonant frequency of the first resonator is the lowest among the resonant frequencies of the first and second resonators which are the parallel resonators and the low frequency side in the attenuation band of the second filter is defined by the resonance point of the first resonator. Therefore, the ripple of the first resonator is generated in a lower frequency band than the attenuation band of the second filter, so that the ripple of the first resonator is generated in a lower frequency band than the pass band of the first filter, which overlaps with the attenuation band of the second filter, thus reducing or preventing deterioration in the bandpass characteristics due to the ripple.

In addition, an attenuation pole of the first resonator may be located at a higher frequency side than an attenuation pole of the second resonator.

When the BEF includes the parallel resonators, the resonant frequencies at which the impedances of the parallel resonators become minimum are the attenuation poles of the BEF. When the ripples are generated at the higher frequency side than the resonant frequencies, the resonant frequency of the first resonator is the highest among respective of the resonant frequencies of the first resonator and the second resonator which are the parallel resonators, and the high frequency side in the attenuation band of the second filter is defined by the resonance point of the first resonator. Therefore, the ripple of the first resonator is generated in a higher frequency band than the attenuation band of the second filter, so that the ripple of the first resonator is generated in a higher frequency band than the pass band of the first filter, which overlaps with the attenuation band of the second filter, thus reducing or preventing deterioration in the bandpass characteristics due to the ripple.

When the BEF includes the series resonators, the anti-resonant frequencies at which the impedances of the series resonators become maximum are the attenuation poles of the BEF. When the ripples are generated at the higher frequency side than the anti-resonant frequencies, the anti-resonant frequency of the first resonator is the highest among the anti-resonant frequencies of the first resonator and the second resonator which are the series resonators respectively and the high frequency side in the attenuation band of the second filter is defined by the anti-resonance point of the first resonator. Therefore, the ripple of the first resonator is generated in a higher frequency band than the attenuation band of the second filter, so that the ripple of the first resonator is generated in a higher frequency band than the pass band of the first filter, which overlaps with the attenuation band of the second filter, thus reducing or preventing deterioration in the bandpass characteristics due to the ripple.

Further, a multiplexer according to another preferred embodiment of the present invention includes a first filter that is provided on a first path connecting a common terminal and a first terminal and is any one of a band pass filter, a low pass filter, and a high pass filter, and a second filter that is provided on a second path connecting the common terminal and a second terminal and is a band elimination filter including a plurality of elastic wave resonators including a first resonator and a second resonator, wherein a pass band of the first filter and an attenuation band of the second filter overlap with each other, the first resonator of the plurality of elastic wave resonators is located at a position closest to the common terminal, and the first resonator generates no ripple in pass bands of the first filter and the second filter.

The first resonator of the plurality of elastic wave resonators is located at the position closest to the common terminal, and is thus most likely to influence the first filter. In other words, the first resonator is directly connected to the first filter with the common terminal interposed therebetween, so that the first resonator is most likely to influence the first filter. Therefore, when the first resonator generates a ripple in the pass band of the first filter, the ripple of the first resonator influences bandpass characteristics of the first filter and the bandpass characteristics are deteriorated. When the first resonator generates a ripple in the pass band of the second filter, the ripple of the first resonator influences bandpass characteristics of the second filter and the bandpass characteristics are deteriorated. To cope with these points, with the multiplexer in this aspect, since the first resonator generates no ripple in the pass bands of the first filter and the second filter, it is possible to reduce or prevent the deterioration in the bandpass characteristics due to the ripple.

The second resonator may generate a ripple in the pass band of the first filter.

With this configuration, even if the ripple of the second resonator is generated in the pass band of the first filter due to design, influences that may be imparted to the first filter by the ripple of the second resonator are attenuated by attenuation characteristics of the first resonator which is located at the position closest to the common terminal. Therefore, the influences hardly impact the bandpass characteristics of the first filter, and deterioration in the bandpass characteristics in the pass band of the first filter due to the ripple of the second resonator is able to be reduced or prevented. Further, it is not necessary to design the second filter such that the second resonator generates no ripple in the pass band of the first filter, thus making it easy to design the second filter.

Further, a design parameter of the first resonator may be a parameter that generates no ripple in the first resonator in the pass bands of the first filter and the second filter. For example, the design parameter may be at least one of Cut-Angles of a piezoelectric substrate provided with the elastic wave resonator, a film thickness or a material of an interdigital transducer (IDT) electrode of the elastic wave resonator, a film thickness or a material of a protection film provided on the IDT electrode, a film thickness or a material of a dielectric film provided on the IDT electrode, and a duty ratio as a ratio of a line width of a plurality of electrode fingers of the IDT electrode relative to an added value of the line width and a space width of the plurality of electrode fingers.

With this configuration, by adjusting at least one of the design parameters of the first resonator, it is possible to easily prevent a ripple from being generated in the first resonator in the pass bands of the first filter and the second filter.

In addition, a design parameter of the second resonator may be substantially the same as the design parameter of the first resonator.

Thus, by making the design parameters of the first resonator and the second resonator substantially the same as each other, it is easy to form the first resonator and the second resonator on the same chip, thus reducing the size of the multiplexer.

In addition, an attenuation amount at a generation frequency of a ripple of the second resonator in a bandpass characteristic of the first resonator may be larger than an attenuation amount at the generation frequency in a bandpass characteristic of the second resonator by equal to or larger than 10 dB.

With this configuration, influences that may be imparted to the first filter by the ripple of the second resonator are attenuated by equal to or larger than 10 dB by the attenuation characteristics of the first resonator, and the ripple hardly influences the bandpass characteristics of the first filter.

In addition, a fractional bandwidth of the attenuation band of the second filter may be equal to or higher than about 3%, for example.

With this configuration, it is possible to reduce or prevent deterioration in the bandpass characteristics due to the ripple in a wide frequency band having the fractional bandwidth of equal to or higher than about 3%, for example.

Further, a high-frequency front-end circuit according to another preferred embodiment of the present invention includes the above-described multiplexer, and an amplification circuit connected to the multiplexer.

With this configuration, it is possible to provide a high-frequency front-end circuit that reduces or prevents deterioration in bandpass characteristics due to a ripple.

Further, a communication apparatus according to still another preferred embodiment of the present invention includes an RF signal processing circuit that processes a high frequency signal which is transmitted and received by an antenna element, and the above-described high-frequency front-end circuit that transmits the high frequency signal between the antenna element and the RF signal processing circuit.

With this configuration, it is possible to provide a communication apparatus capable of reducing or preventing deterioration in bandpass characteristics due to a ripple.

The multiplexers, the high-frequency front-end circuits, and the communication apparatuses according to preferred embodiments of the present invention reduce or prevent deterioration in bandpass characteristics due to a ripple.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
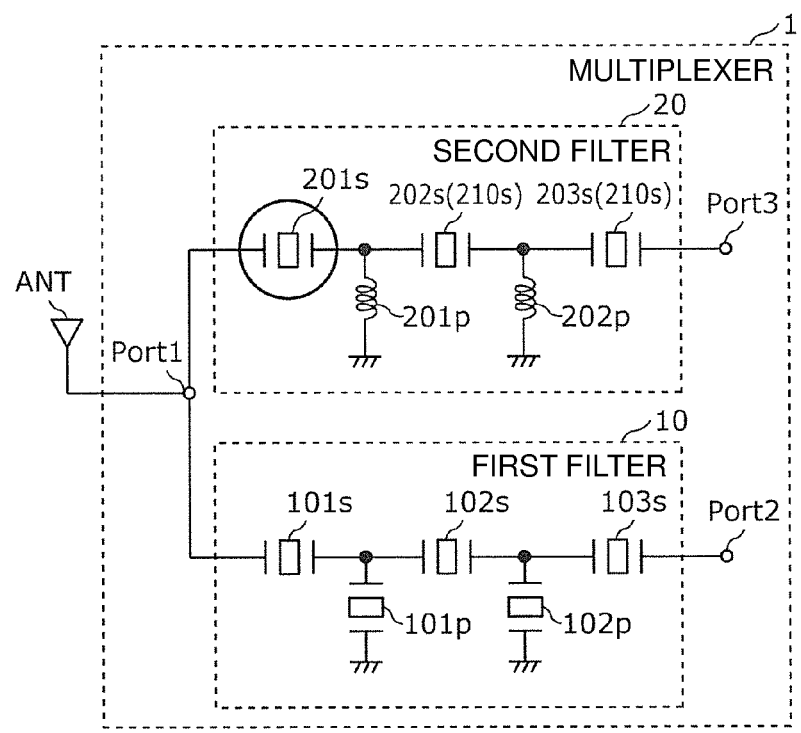
FIG. 1 is a configuration diagram illustrating an example of a multiplexer according to a first preferred embodiment of the present invention.

Hereinafter, non-limiting examples of the present invention will be described in detail with reference to preferred embodiments and the drawings. It should be noted that each of the preferred embodiments, which will be described below, represents a comprehensive or specific example. Numerical values, shapes, materials, components, arrangement and connection forms of the components, steps (processes) and the order of the steps, and the like indicated in the following preferred embodiments are merely examples and are not intended to limit the present invention. Components of the following preferred embodiments, which are not described in the independent scope of the present invention, will be described as optional components. Also, sizes or ratios of the sizes of the components illustrated in the drawings are not restrictive.

First Preferred Embodiment

A multiplexer 1 according to a first preferred embodiment of the present invention will be described with reference to FIG. 1 to FIG. 4.

First, the configuration of the multiplexer 1 according to the first preferred embodiment will be described with reference to FIG. 1.

FIG. 1 is a configuration diagram illustrating an example of the multiplexer 1 according to the first preferred embodiment. FIG. 1 illustrates an antenna element ANT as well, which is connected to a common terminal Port1 of the multiplexer 1.

The multiplexer 1 is a splitter that includes a plurality of filters having different pass bands and in which terminals of these filters at the antenna ANT side are commonly connected to the common terminal Port1. In the present preferred embodiment, the multiplexer 1 is a duplexer including two filters, for example.

As illustrated in FIG. 1, the multiplexer 1 includes the common terminal Port1, a first terminal Port2 and a second terminal Port3, and a first filter 10 and a second filter 20.

The common terminal Port1 is provided commonly to the first filter 10 and the second filter 20 and is connected to the first filter 10 and the second filter 20, for example, inside the multiplexer 1. Note that the common terminal Port1 may be connected to the first filter 10 and the second filter 20 outside the multiplexer 1. The common terminal Port1 is connected to the antenna element ANT.

The first terminal Port2 and the second terminal Port3 are provided so as to correspond to the first filter 10 and the second filter 20, respectively, the first terminal Port2 is connected to the first filter 10, and the second terminal Port3 is connected to the second filter 20. Further, the first terminal Port2 and the second terminal Port3 are connected to an RFIC (Radio Frequency Integrated Circuit (not illustrated)) with an amplification circuit (not illustrated) or the like interposed therebetween.

The first filter 10 is any one of a BPF (band pass filter), an LPF (low pass filter), and an HPF (high pass filter), which is provided on a first path connecting the common terminal Port1 and the first terminal Port2. In the present preferred embodiment, the first filter 10 is, for example, the BPF.

As illustrated in FIG. 1, the first filter 10 includes series resonators 101$s$ to 103$s$ and parallel resonators 101$p$ and 102$p$. The series resonators 101$s$ to 103$s$ and the parallel resonators 101$p$ and 102$p$ are, for example, elastic wave resonators. The elastic wave resonator is a resonator such as a SAW resonator, a BAW resonator, and an FBAR resonator, or the like. The series resonators 101$s$ to 103$s$ are connected in series on a path (series arm) connecting the common terminal Port1 and the first terminal Port2. Further, the parallel resonators 101$p$ and 102$p$ are connected in parallel on a path (parallel arm) connecting a connection point of the series resonator 101$s$ and the series resonator 102$s$ and the ground and on a path (parallel arm) connecting a connection point of the series resonator 102$s$ and the series resonator 103$s$ and the ground, respectively. With the above-described connection configuration of the series resonators 101$s$ to 103$s$ and the parallel resonators 101$p$ and 102$p$, the first filter 10 defines a ladder BPF.

As described above, the first filter 10 has a ladder filter structure including at least one series resonator (three series resonators 101$s$ to 103$s$ in the present preferred embodiment) and at least one parallel resonator (two parallel resonators 101$p$ and 102$p$ in the present preferred embodiment). Thus, it is possible to finely adjust bandpass characteristics of the whole first filter 10.

The second filter 20 is a BEF (band elimination filter) provided on a second path connecting the common terminal Port1 and the second terminal Port3 and including at least one elastic wave resonator. In the present preferred embodiment, the second filter includes at least one, for example, SAW resonator. The SAW resonators (a first resonator 201$s$ and second resonators 202$s$ and 203$s$ to be described later) of the second filter 20 are formed using LN (LiNbO$_3$) substrates. A main mode thereof is, for example, an SH wave, and unwanted modes (unwanted waves) such as an SV wave are present in addition to the main mode.

As illustrated in FIG. 1, in the present preferred embodiment, the at least one elastic wave resonator is a plurality of elastic wave resonators including the first resonator and the second resonators. Thus, an attenuation band of the second filter 20 can be widened, and, for example, a fractional bandwidth of the attenuation band of the second filter 20 can be set to equal to or higher than about 3%. Here, among the at least one elastic wave resonator (the plurality of elastic wave resonators), an elastic wave resonator (an elastic wave resonator surrounded by a circle in FIG. 1) closest to the common terminal Port1 will be referred to as the first resonator 201$s$. In addition, elastic wave resonators that are not the first resonator 201$s$ among the plurality of elastic wave resonators are referred to as second resonators 210$s$. In the present preferred embodiment, the second filter 20 includes three series resonators as the plurality of elastic wave resonators, and the second resonators 202$s$ and 203$s$ that are not the first resonator 201$s$ among the three series resonators are collectively referred to as the second resonators 210$s$.

The second filter 20 includes the first resonator 201$s$, the second resonators 202$s$ and 203$s$, and parallel inductors 201$p$ and 202$p$. The first resonator 201$s$ and the second resonators 202$s$ and 203$s$ are respectively connected in series on a path (series arm) connecting the common terminal Port1 and the second terminal Port3. Further, the parallel inductors 201$p$ and 202$p$ are connected in parallel on a path (parallel arm) connecting a connection point of the first resonator 201$s$ and the second resonator 202$s$ and the ground and on a path (parallel arm) connecting a connection point of the second resonator 202$s$ and the second resonator 203$s$ the ground. With the above-described connection configuration, in the second filter 20, a portion of a pass band of an HPF by the parallel inductors 201$p$ and 202$p$ defines the BEF attenuated by the first resonator 201$s$ and the second resonators 202$s$ and 203$s$.

As described above, the second filter 20 includes the at least one series resonator (three resonators including the first resonator 201$s$ and the second resonators 202$s$ and 203$s$ in the present preferred embodiment) and the at least one parallel inductor (two parallel inductors 201$p$ and 202$p$ in the present preferred embodiment).

Next, bandpass characteristics of the multiplexer 1 will be described, but first, bandpass characteristics of a multiplexer according to a comparative example of the first preferred embodiment will be described with reference to FIG. 2.

Figure 2:
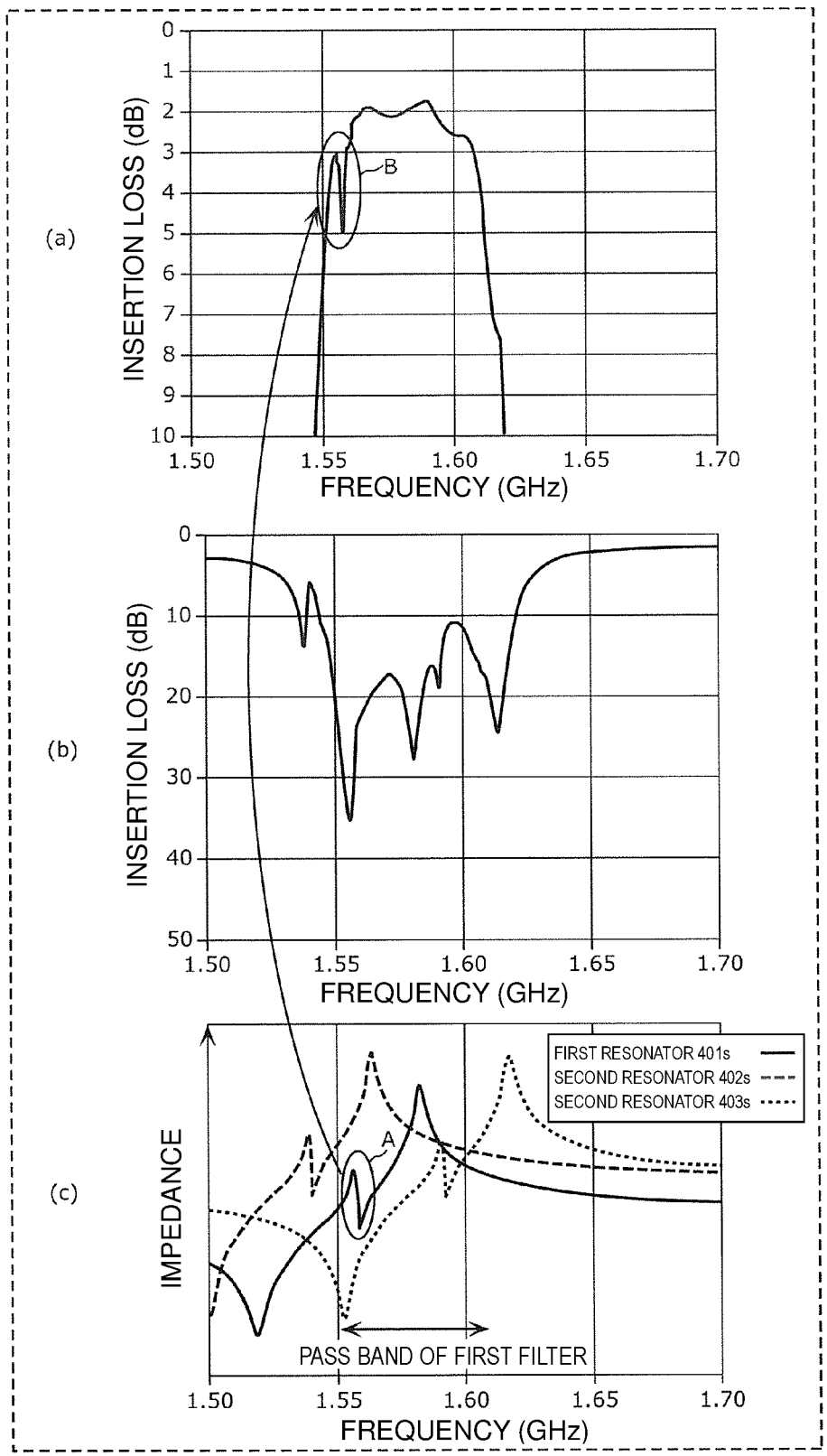
FIG. 2 is a graph for explaining influences by a ripple of a first resonator according to a comparative example of the first preferred embodiment of the present invention.

FIG. 2 is a graph for explaining influences by a ripple of a first resonator 401$s$ according to the comparative example of the first preferred embodiment. Portion (a) of FIG. 2 is a graph illustrating an example of bandpass characteristics of a first filter 10 according to the comparative example of the first preferred embodiment. Portion (b) of FIG. 2 is a graph illustrating an example of bandpass characteristics of a second filter 20$a$ according to the comparative example of the first preferred embodiment. For example, when attention is paid to the first path connecting the common terminal Port1 and the first terminal Port2, portion (a) of FIG. 2 illustrates IL (insertion loss) indicating loss caused by the first filter 10 when a signal input to the common terminal Port1 passes through the first filter 10 and is transmitted to the first terminal Port2. Further, when attention is paid to the second path connecting the common terminal Port1 and the second terminal Port3, for example, portion (b) of FIG. 2 illustrates IL caused by the second filter 20a when a signal input to the common terminal Port1 passes through the second filter 20a and is transmitted to the second terminal Port3. Similar IL is illustrated in each of portions (a) and (b) of FIG. 3, portions (a) and (b) of FIG. 6, and portions (a) and (b) of FIG. 7, which will be described later. Portion (c) of FIG. 2 is a graph illustrating an example of impedance characteristics of the first resonator 401s and second resonators 402s and 403s according to the comparative example of the first preferred embodiment.

The multiplexer according to the comparative example has the same circuit configuration as that of the multiplexer according to the first preferred embodiment of the present application except that the second filter 20a uses the first resonator 401s and the second resonators 402s and 403s instead of the first resonator 201s and the second resonators 202s and 203s. The first resonator 401s and the second resonators 402s and 403s are SAW resonators formed using LN substrates, and unwanted modes (unwanted waves) are present in addition to a main mode to realize filter characteristics (attenuation characteristics) as illustrated in portion (b) of FIG. 2. When the unwanted modes are generated in the first resonator 401s and the second resonators 402s and 403s, ripples which are the phenomena that impedance characteristics of these resonators change locally at specific frequencies are generated.

In this comparative example, the first resonator 401s is a series resonator provided on a series arm of the second path, and a ripple is generated between a resonance point and an anti-resonance point (that is, in a lower frequency band than a frequency at the anti-resonance point) in the impedance characteristics of the first resonator 401s as indicated by part A in portion (c) of FIG. 2. Similarly, ripples are generated also between resonance points and anti-resonance points in the impedance characteristics of the second resonators 402s and 403s. Since an attenuation band of the second filter 20a is defined by the anti-resonance points of the first resonator 401s and the second resonators 402s and 403s, frequencies at which the ripples are generated in the vicinity of these anti-resonance points are the attenuation band of the second filter 20a in many cases.

In order to prevent a signal having a frequency in the pass band of the first filter 10 from entering the second filter 20a, as illustrated in portions (a) and (b) of FIG. 2, the pass band of the first filter 10 and the attenuation band of the second filter 20a overlap with each other. Therefore, ripples of the first resonator 401s and the second resonators 402s and 403s of the second filter 20a are likely to be generated in the pass band of the first filter 10, which overlaps with the attenuation band of the second filter 20a. In portion (c) of FIG. 2, ripples of the first resonator 401s and the second resonator 403s are generated in the pass band of the first filter 10. Note that overlapping of two bands is not intended to be limited to the case where the two bands completely match with each other. That is, overlapping of the two bands includes the case where the two bands substantially match with each other i.e., the two bands do not match with each other in some portions.

When the ripples of the elastic wave resonators of the second filter 20a are generated in the pass band of the first filter 10, the ripples may influence bandpass characteristics in the pass band. In particular, the first resonator 401s is provided at a position closest to the common terminal Port1 among the first resonator 401s and the second resonators 402s and 403s, and is thus likely to influence the first filter 10. In other words, the first resonator 401s is directly connected to the first filter 10 with the common terminal Port1 interposed therebetween, so that the first resonator 401s is likely to influence the first filter 10. Therefore, the ripple of the first resonator 401s indicated by the part A in portion (c) of FIG. 2 deteriorates the bandpass characteristics in the pass band of the first filter 10 as indicated by part B in portion (a) of FIG. 2.

As described above, in the multiplexer according to the comparative example of the first preferred embodiment, the ripple of the first resonator 401s is generated in the pass band of the first filter 10, and the bandpass characteristics in the pass band of the first filter 10 are deteriorated.

Next, the bandpass characteristics of the multiplexer 1 according to the first preferred embodiment will be described with reference to FIG. 3.

Figure 3:
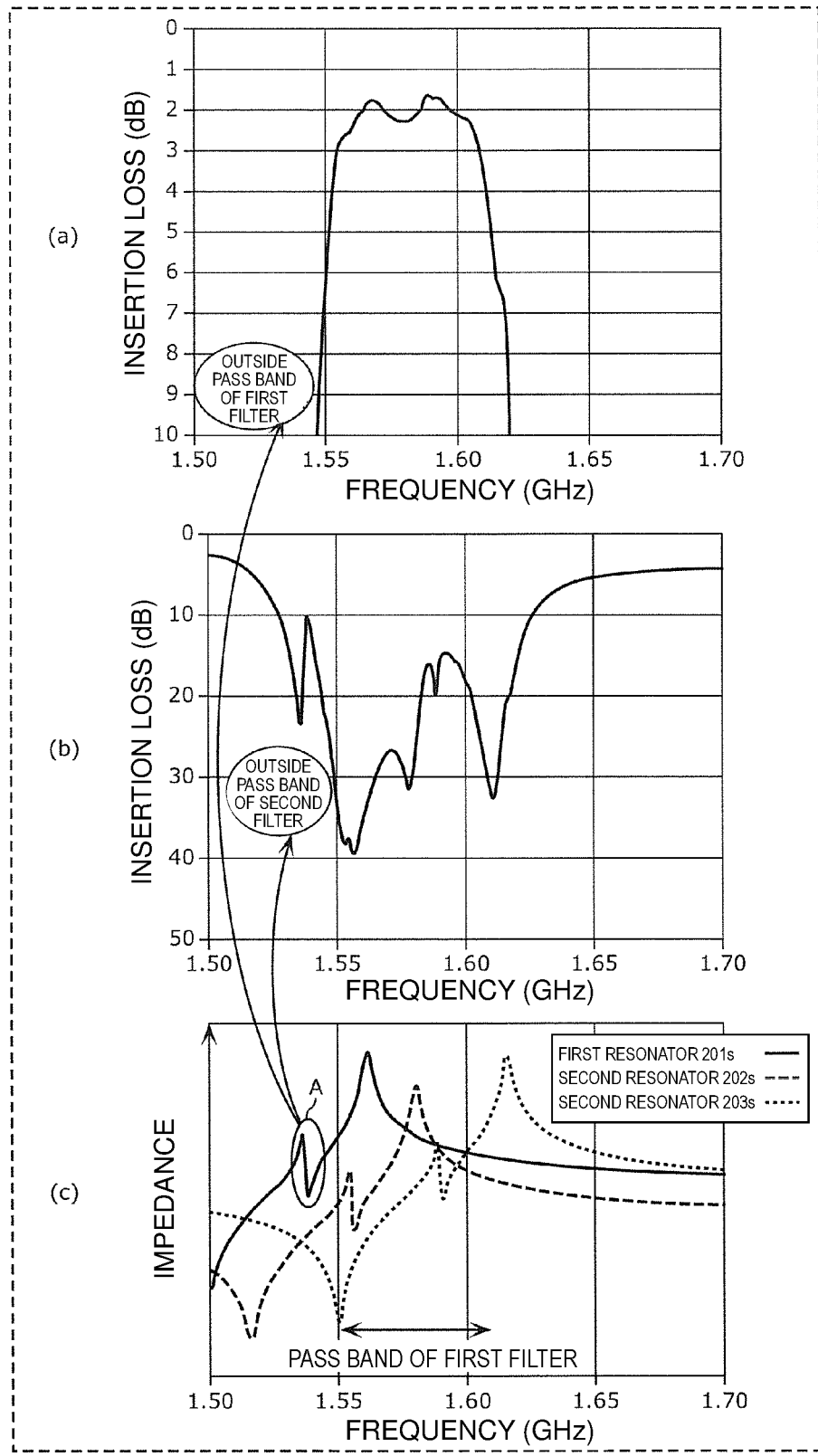
FIG. 3 is a graph for explaining influences by a ripple of a first resonator according to the first preferred embodiment of the present invention.

FIG. 3 is a graph for explaining influences by a ripple of the first resonator 201s according to the first preferred embodiment. Portion (a) of FIG. 3 is a graph illustrating an example of bandpass characteristics of the first filter 10 according to the first preferred embodiment. Portion (b) of FIG. 3 is a graph illustrating an example of bandpass characteristics of the second filter 20 according to the first preferred embodiment. Portion (c) of FIG. 3 is a graph illustrating an example of impedance characteristics of the first resonator 201s and the second resonators 202s and 203s according to the first preferred embodiment.

In the comparative example, the frequency at the anti-resonance point of the first resonator 401s is higher than the frequency at the anti-resonance point of the second resonator 402s and is lower than the frequency at the anti-resonance point of the second resonator 403s. On the other hand, in the first preferred embodiment, a resonant frequency of the first resonator 201s is the lowest among resonant frequencies of the plurality of elastic wave resonators (the first resonator 201s and the second resonators 202s and 203s). In other words, a frequency at an anti-resonance point of the first resonator 201s is lower than frequencies at anti-resonance points of the second resonators 210s (202s and 203s).

The first resonator 201s and the second resonators 210s are the SAW resonators including the LN substrates, and unwanted modes (unwanted waves) are present in addition to a main mode to realize filter characteristics (attenuation characteristics) as illustrated in portion (b) of FIG. 3. When the unwanted modes are respectively generated in the first resonator 201s and the second resonators 210s, ripples are generated in these resonators.

In the present preferred embodiment, the first resonator 201s is the series resonator provided on the series arm of the second path, and a ripple is generated between the resonance point and the anti-resonance point (that is, in a lower frequency band than the frequency at the anti-resonance point) in the impedance characteristics of the first resonator 201s as indicated in part A in portion (c) of FIG. 3. Similarly, ripples are generated also between the resonance points and the anti-resonance points in the impedance characteristics of the second resonators 210s. Since an attenuation band of the second filter 20 is defined by the anti-resonance points of the first resonator 201s and the second resonators 210s, frequencies at which the ripples are generated in the vicinity of these anti-resonance points are the attenuation band of the second filter 20 in many cases.

In order to prevent a signal having a frequency in the pass band of the first filter 10 from entering the second filter 20, as illustrated in portions (a) and (b) of FIG. 3, the pass band of the first filter 10 and the attenuation band of the second filter 20 overlap with each other. Therefore, ripples of the first resonator 201s and the second resonators 210s of the second filter 20 are likely to be generated in the pass band of the first filter 10, which overlaps with the attenuation band of the second filter 20.

However, the frequency at the anti-resonance point of the first resonator 201s is lower than the frequencies at the anti-resonance points of the second resonators 210s. In other words, a low frequency side in the attenuation band of the second filter 20 is defined by the anti-resonance point of the first resonator 201s. Since the ripple of the first resonator 201s is generated in a lower frequency band than the anti-resonance point of the low frequency side in the attenuation band of the second filter 20, it is generated outside the attenuation band (i.e., outside the pass band of the first filter 10). On the other hand, the anti-resonance points of the second resonators 210s define middle and high frequency sides except for the low frequency side in the attenuation band of the second filter 20. Although the ripples of the second resonators 210s are generated in lower frequency bands than the anti-resonance points of the middle and high frequency sides in the attenuation band of the second filter 20, they are generated in the attenuation band of the second filter 20 (i.e., the pass band of the first filter 10). Therefore, as illustrated in portion (c) of FIG. 3, the ripples of the second resonators 210s are generated in the pass band of the first filter 10, and the ripple of the first resonator 201s is generated outside the pass band of the first filter 10.

In a case that the frequencies at which the ripples of the elastic wave resonators of the second filter 20 are generated and the pass band of the first filter 10 overlap with each other, the ripples may influence the bandpass characteristics in the pass band. In particular, the first resonator 201s is provided at the position closest to the common terminal Port1 among the first resonator 201s and the second resonators 210s, and is thus likely to influence the first filter 10. In other words, the first resonator 201s is directly connected to the first filter 10 with the common terminal Port1 interposed therebetween, so that the first resonator 201s is likely to influence the first filter 10. However, in the present preferred embodiment, since the ripple of the first resonator 201s is generated outside the pass band of the first filter 10, the ripple has less influence on the bandpass characteristics in the pass band of the first filter 10.

In addition, the first resonator 201s is interposed between the second resonators 210s and the common terminal Port1. Although the ripples of the second resonators 210s are generated in the pass band of the first filter 10, the influences that can be imparted to the first filter 10 by the ripples of the second resonators 210s are attenuated by the attenuation characteristics of the first resonator 201s and hardly appear in the bandpass characteristics of the first filter 10. The attenuation amount at the generation frequencies of the ripples of the second resonators 210s in the bandpass characteristics of the first resonator 201s is larger than the attenuation amount at the generated frequencies in the bandpass characteristics of the second resonators 210s by, for example, equal to or larger than 10 dB. Thus, the influences that can be imparted to the first filter 10 by the ripples of the second resonators 210s are attenuated by equal to or larger than 10 dB by the attenuation characteristics of the first resonator 201s, and the influences by the ripples of the second resonators 210s hardly appear in the bandpass characteristics of the first filter 10. Therefore, as illustrated in portion (a) of FIG. 3, deterioration in the bandpass characteristics in the pass band of the first filter 10 due to the ripples of the second resonators 210s is reduced or prevented. With this configuration, even if the ripples of the second resonators 210s are generated in the pass band of the first filter 10 due to design, the deterioration in the bandpass characteristics in the pass band of the first filter 10 is able to be reduced or prevented.

Further, as illustrated in portion (b) of FIG. 3, the ripple of the first resonator 201s is generated outside the pass band of the second filter 20. In other words, the ripple of the first resonator 201s is generated only outside the pass band of the first filter 10 and outside the pass band of the second filter 20. Here, the pass band of the second filter 20 (BEF) is a band in which attenuation is not made by the BEF, and is, for example, a band of equal to or lower than about 1.5 GHz in portion (b) of FIG. 3. Accordingly, the deterioration in the bandpass characteristics in the pass band of the second filter 20 is also able to be reduced or prevented.

As described above, in the multiplexer 1 according to the first preferred embodiment, the ripple of the first resonator 201s is generated only outside the pass bands of the first filter 10 and the second filter 20, and the deterioration in the bandpass characteristics in the pass bands of the first filter 10 and the second filter 20 is able to be reduced or prevented. Specifically, in the case where the first resonator 201s and the second resonators 210s are the series resonators provided on the series arm of the second path and ripples are generated in lower frequency bands than the frequencies at the anti-resonance points, the deterioration in the bandpass characteristics in the pass bands of the first filter 10 and the second filter 20 is able to be reduced or prevented by lowering the resonant frequency of the first resonator 201s to be the lowest among the resonant frequencies of the first resonator 201s and the second resonators 210s.

Similarly, in the case where the first resonator 201s and the second resonators 210s are the series resonators provided on the series arm of the second path and the ripples are generated in higher frequency bands than the frequencies of the anti-resonance points, the deterioration in the bandpass characteristics in the pass bands of the first filter 10 and the second filter 20 is able to be reduced or prevented by increasing the resonant frequency of the first resonator 201s to be the highest among the resonant frequencies of the first resonator 201s and the second resonators 210s.

Although the ripple of the first resonator 201s is generated only outside the pass bands of the first filter 10 and the second filter 20 in the present preferred embodiment, the first resonator 201s can be designed such that the first resonator 201s generates no ripple. However, by designing the first resonator 201s such that the first resonator 201s generates no ripple, a Q value (the degree of sharpness) of the first resonator 201s is deteriorated. This will be described with reference to FIG. 4.

Figure 4:
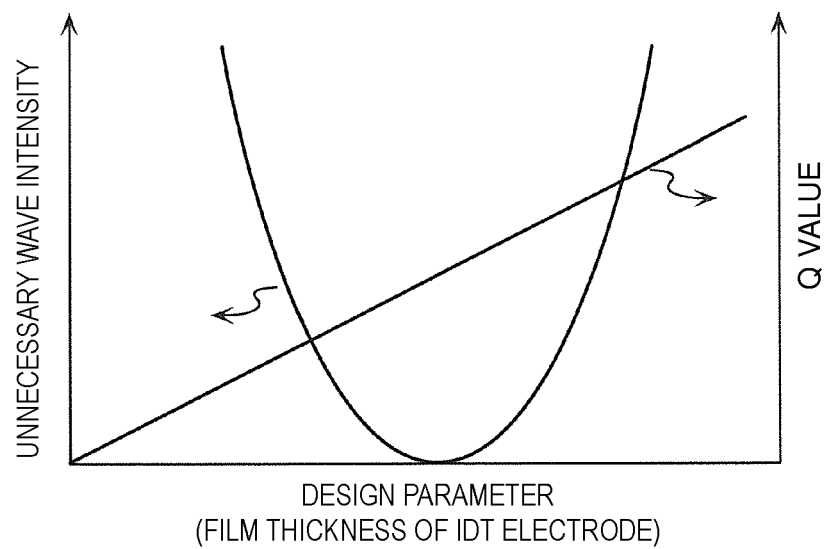
FIG. 4 is a graph illustrating an example of a relationship among a design parameter, an unwanted wave intensity, and a Q value.

FIG. 4 is a graph illustrating an example of a relationship among a design parameter, an unwanted wave intensity, and the Q value. The unwanted wave intensity illustrated in FIG. 4 is an intensity of unwanted modes (unwanted waves) other than a main mode to realize filter characteristics (attenuation characteristics) of an elastic wave resonator, and as the unwanted wave intensity is larger, a change amount of impedance characteristics due to a ripple is larger. In other words, as the unwanted wave intensities of the elastic wave resonators of the second filter 20 are higher, the influences by the ripples of the elastic wave resonators on the bandpass characteristics of the first filter 10 become larger. That is to say, by setting the unwanted wave intensities of the elastic wave resonators of the second filter 20 to be substantially 0, it is possible to prevent the ripples of the elastic wave resonators from being generated.

Adjustment of a film thickness of an IDT (InterDigital Transducer) electrode as the design parameter of the elastic wave resonator, for example, can prevent a ripple of the elastic wave resonator from being generated. On the other hand, as the film thickness of the IDT electrode of the elastic wave resonator is increased, the Q value of the elastic wave resonator becomes higher. However, as illustrated in FIG. 4, it is difficult to adjust the design parameter so as to increase the Q value of the elastic wave resonator and prevent the ripple of the elastic wave resonator from being generated. In other words, when the Q value of the elastic wave resonator is increased, the ripple of the elastic wave resonator is undesirably generated.

As described above, it is difficult to achieve both of increase in the Q value of the elastic wave resonator and prevention of the ripple of the elastic wave resonator from being generated. Accordingly, in the multiplexer 1 according to the first preferred embodiment, although the ripple of the first resonator 201s is generated, the deterioration in the bandpass characteristics due to the ripple is reduced or prevented by causing the ripple to be generated only outside the pass bands of the first filter 10 and the second filter 20.

Second Preferred Embodiment

Next, a multiplexer 2 according to a second preferred embodiment of the present invention will be described with reference to FIG. 5 to FIG. 7.

First, the configuration of the multiplexer 2 according to the second preferred embodiment will be described with reference to FIG. 5.

Figure 5:
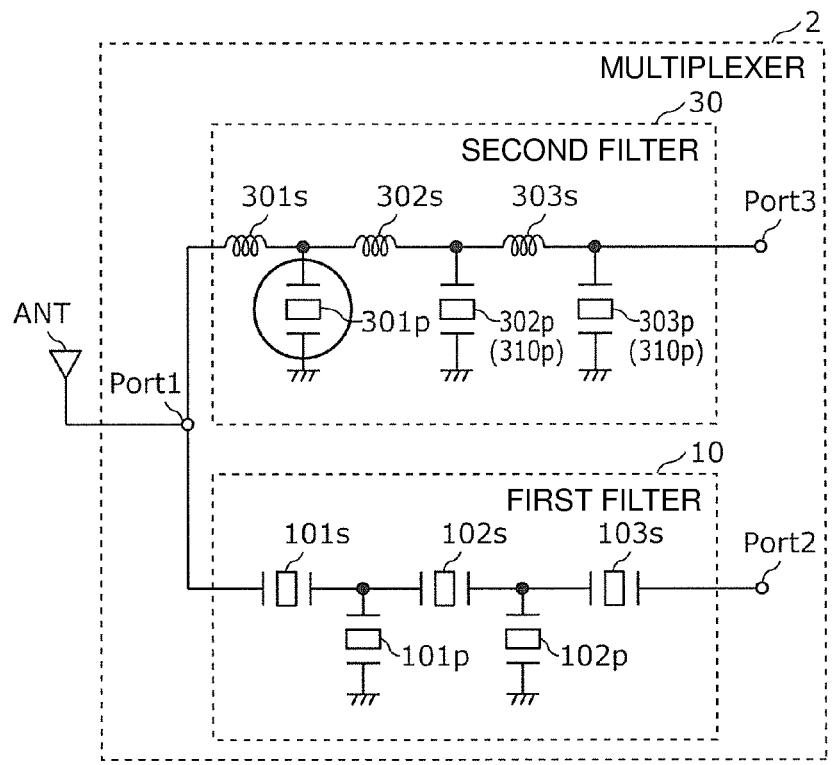
FIG. 5 is a configuration diagram illustrating an example of a multiplexer according to a second preferred embodiment of the present invention.

FIG. 5 is a configuration diagram illustrating an example of the multiplexer 2 according to the second preferred embodiment. FIG. 5 illustrates the antenna element ANT as well, which is connected to the common terminal Port1 of the multiplexer 2.

The multiplexer 2 differs from the multiplexer 1 according to the first preferred embodiment in that it includes a second filter 30 in place of the second filter 20. Since the other configurations are the same as those in the first preferred embodiment, description thereof will be omitted.

The second filter 30 is a BEF including at least one elastic wave resonator, which is provided on a second path connecting the common terminal Port1 and the second terminal Port3. The second filter 30 includes at least one, for example, SAW resonator. The SAW resonators (a first resonator 301p and second resonators 302p and 303p, which will be described later) of the second filter 30 include LN substrates. A main mode thereof is, for example, an SH wave, and unwanted modes (unwanted waves) such as an SV wave are present in addition to the main mode.

As illustrated in FIG. 5, in the present preferred embodiment, the at least one elastic wave resonator includes a plurality of elastic wave resonators including the first resonator and the second resonators. Thus, an attenuation band of the second filter 30 is able to be widened, and, for example, a fractional bandwidth of an attenuation band of the second filter 30 can be set to equal to or higher than about 3%. Here, among the at least one elastic wave resonator (the plurality of elastic wave resonators), an elastic wave resonator (an elastic wave resonator surrounded by a circle in FIG. 5) closest to the common terminal Port1 will be referred to as the first resonator 301p. In addition, elastic wave resonators that are not the first resonator 301p among the plurality of elastic wave resonators are referred to as second resonators 310p. In the present preferred embodiment, the second filter 30 includes three parallel resonators as the plurality of elastic wave resonators, and the second resonators 302p and 303p that are not the first resonator 301p among the three parallel resonators are collectively referred to as the second resonators 310p.

The second filter 30 includes the first resonator 301p, the second resonators 302p and 303p, and series inductors 301s, 302s, and 303s. The series inductors 301s, 302s, and 303s are respectively connected in series on a path (series arm) connecting the common terminal Port1 and the second terminal Port3. Further, the first resonator 301p and the second resonators 302p and 303p are connected in parallel on a path (parallel arm) connecting a connection point of the series inductor 301s and the series inductor 302s and the ground and on a path (parallel arm) connecting a connection point of the series inductor 302s and the series inductor 303s and the ground, respectively. With the above-described connection configuration, in the second filter 30, a part of a pass band of an LPF by the series inductors 301s, 302s, and 303s defines the BEF attenuated by the first resonator 301p and the second resonators 302p and 303p.

As described above, the second filter 30 includes the at least one series inductor (three series inductors 301s, 302s, and 303s in the present preferred embodiment) and the at least one parallel resonator (three resonators including the first resonator 301p and the second resonators 302p and 303p in the present preferred embodiment).

Next, bandpass characteristics of the multiplexer 2 will be described, but first, bandpass characteristics of a multiplexer according to a comparative example of the second preferred embodiment will be described with reference to FIG. 6.

Figure 6:
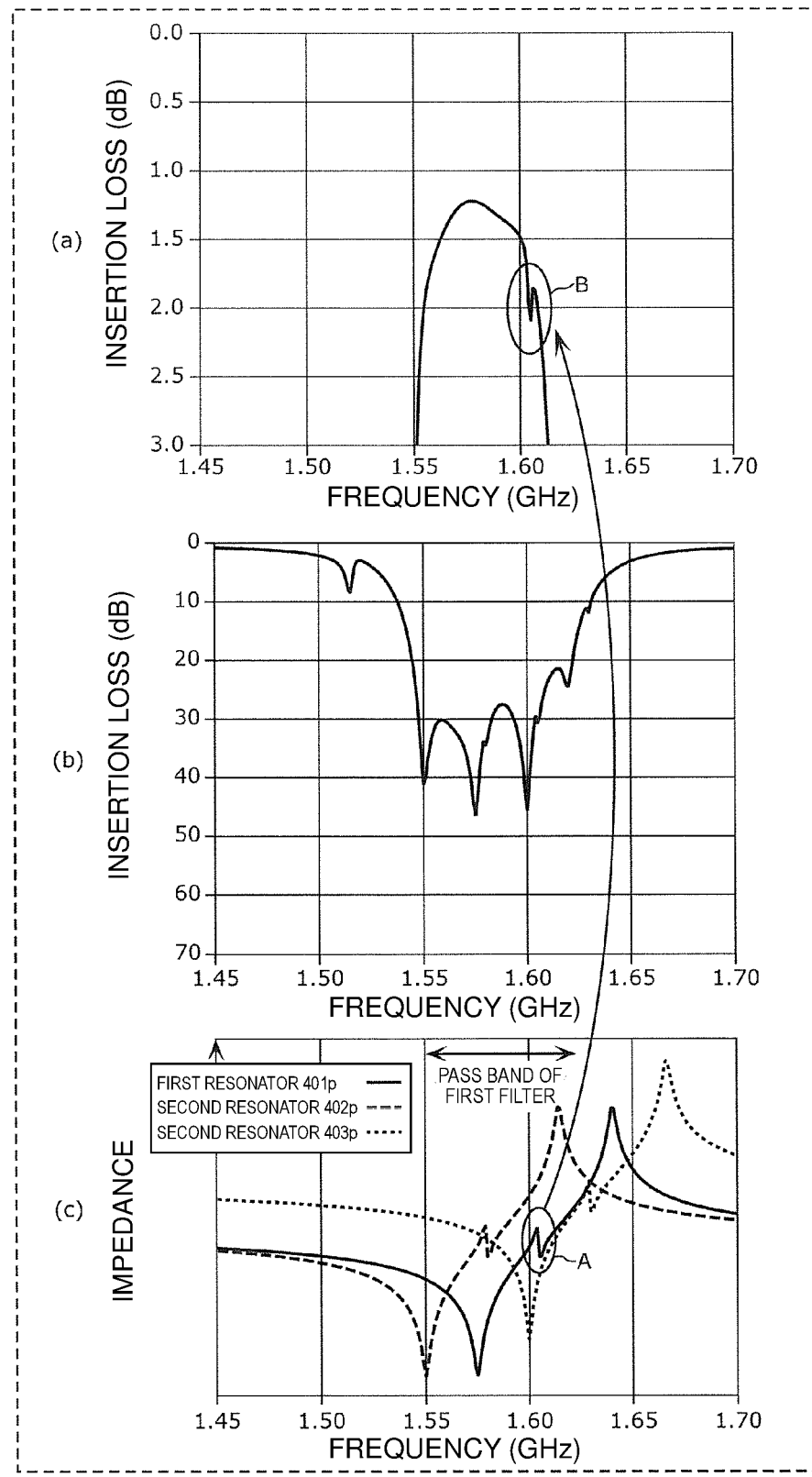
FIG. 6 is a graph for explaining influences by a ripple of a first resonator according to a comparative example of the second preferred embodiment of the present invention.

FIG. 6 is a graph for explaining influences by a ripple of a first resonator 401p according to the comparative example of the second preferred embodiment. Portion (a) of FIG. 6 is a graph illustrating an example of bandpass characteristics of the first filter 10 according to the comparative example of the second preferred embodiment. Portion (b) of FIG. 6 is a graph illustrating an example of bandpass characteristics of a second filter 30a according to the comparative example of the second preferred embodiment. Portion (c) of FIG. 6 is a graph illustrating an example of impedance characteristics of the first resonator 401p and second resonators 402p and 403p according to the comparative example of the second preferred embodiment.

The multiplexer according to the comparative example has the same circuit configuration as that of the multiplexer according to the second preferred embodiment of the present application except that the second filter 30a uses the first resonator 401p and the second resonators 402p and 403p instead of the first resonator 301p and the second resonators 302p and 303p. The first resonator 401p and the second resonators 402p and 403p are SAW resonators including LN substrates, and unwanted modes (unwanted waves) are present in addition to a main mode to realize filter characteristics (attenuation characteristics) as illustrated in portion (b) of FIG. 6. When the unwanted modes are generated in the first resonator 401p and the second resonators 402p and 403p, ripples are respectively generated in these resonators.

In this comparative example, the first resonator 401p is a parallel resonator provided on a parallel arm of the second path, and a ripple is generated between a resonance point and an anti-resonance point (that is, in a higher frequency band than a frequency at the resonance point) in the impedance characteristics of the first resonator 401p as indicated in part A in portion (c) of FIG. 6. Similarly, ripples are generated also between resonance points and anti-resonance points in the impedance characteristics of the second resonators 402p and 403p. Since an attenuation band of the second filter 30a is defined by the resonance points of the first resonator 401p and the second resonators 402p and 403p, frequencies at which the ripples are generated in the vicinity of these resonance points are the attenuation band of the second filter 30a in many cases.

In order to prevent a signal having a frequency in the pass band of the first filter 10 from entering the second filter 30a, as illustrated in portions (a) and (b) of FIG. 6, the pass band of the first filter 10 and the attenuation band of the second filter 30a overlap with each other. Therefore, ripples of the first resonator 401p and the second resonators 402p and 403p of the second filter 30a are likely to be generated in the pass band of the first filter 10, which overlaps with the attenuation band of the second filter 30a. In portion (c) of FIG. 6, ripples of the first resonator 401p and the second resonator 402p are respectively generated in the pass band of the first filter 10.

When the ripples of the elastic wave resonators of the second filter 30a are generated in the pass band of the first filter 10, the ripples may influence bandpass characteristics in the pass band. In particular, the first resonator 401p is provided at the position closest to the common terminal Port1 among the first resonator 401p and the second resonators 402p and 403p, and is thus likely to influence the first filter 10. In other words, the first resonator 401p is directly connected to the first filter 10 with the common terminal Port1 interposed therebetween, so that the first resonator 401p is likely to influence the first filter 10. Therefore, the ripple of the first resonator 401p indicated by the part A in portion (c) of FIG. 6 deteriorates the bandpass characteristics in the pass band of the first filter 10 as indicated by part B in portion (a) of FIG. 6.

As described above, in the multiplexer according to the comparative example of the second preferred embodiment, the ripple of the first resonator 401p is generated in the pass band of the first filter 10, and the bandpass characteristics in the pass band of the first filter 10 are deteriorated.

Next, the bandpass characteristics of the multiplexer 2 according to the second preferred embodiment will be described with reference to FIG. 7.

Figure 7:
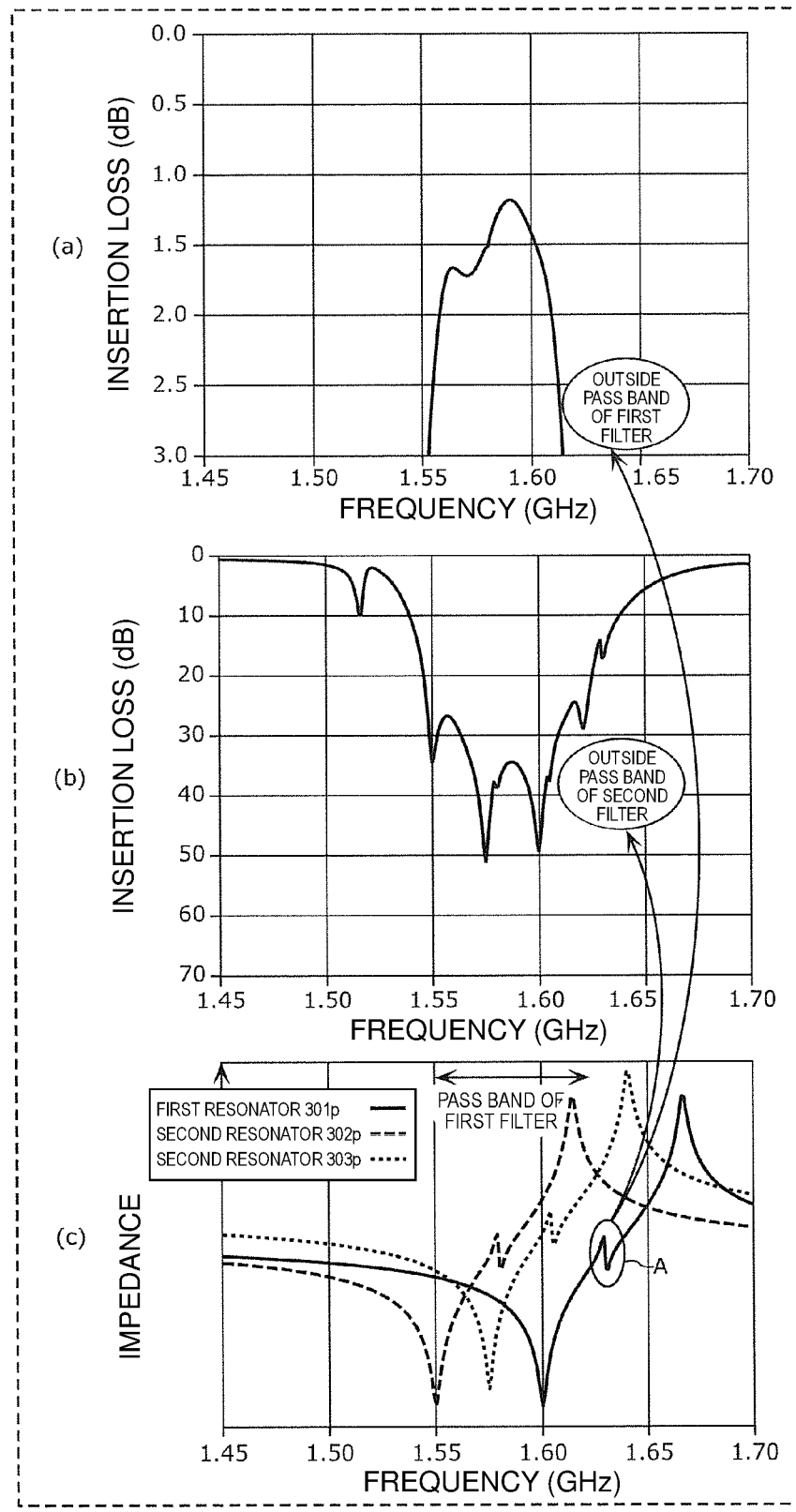
FIG. 7 is a graph for explaining influences by a ripple of a first resonator according to the second preferred embodiment of the present invention.

FIG. 7 is a graph for explaining influences by a ripple of the first resonator 301p according to the second preferred embodiment. Portion (a) of FIG. 7 is a graph illustrating an example of bandpass characteristics of the first filter 10 according to the second preferred embodiment. Portion (b) of FIG. 7 is a graph illustrating an example of bandpass characteristics of the second filter 30 according to the second preferred embodiment. Portion (c) of FIG. 7 is a graph illustrating an example of impedance characteristics of the first resonator 301p and the second resonators 302p and 303p according to the second preferred embodiment.

In the comparative example, the frequency at the resonance point of the first resonator 401p is higher than the frequency at the resonance point of the second resonator 402p and is lower than the frequency at the resonance point of the second resonator 403p. On the other hand, in the second preferred embodiment, a resonant frequency of the first resonator 301p is the highest among resonant frequencies of the plurality of elastic wave resonators (the first resonator 301p and the second resonators 302p and 303p). In other words, the frequency at the resonance point of the first resonator 301p is higher than the frequencies at the resonance points of the second resonators 310p (302p and 303p).

The first resonator 301p and the second resonators 310p are the SAW resonators including the LN substrates, and unwanted modes (unwanted waves) are present in addition to a main mode to realize filter characteristics (attenuation characteristics) as illustrated in portion (b) of FIG. 7. When the unwanted modes are generated in the first resonator 301p and the second resonators 310p, ripples are respectively generated in these resonators.

In the present preferred embodiment, the first resonator 301p is the parallel resonator provided on the parallel arm of the second path, and a ripple is generated between the resonance point and an anti-resonance point (that is, in a higher frequency band than the frequency at the resonance point) in the impedance characteristics of the first resonator 301p as indicated in part A in portion (c) of FIG. 7. Similarly, ripples are generated also between the resonance points and anti-resonance points in the impedance characteristics in the second resonators 310p. Since an attenuation band of the second filter 30 is defined by the resonance points of the first resonator 301p and the second resonators 310p, frequencies at which the ripples are generated in the vicinity of these resonance points are the attenuation band of the second filter 30 in many cases.

In order to prevent a signal having a frequency in the pass band of the first filter 10 from entering the second filter 30, as illustrated in portions (a) and (b) of FIG. 7, the pass band of the first filter 10 and the attenuation band of the second filter 30 overlap with each other. Therefore, the ripples of the first resonator 301p and the second resonators 310p of the second filter 30 are likely to be generated in the pass band of the first filter 10, which overlaps with the attenuation band of the second filter 30.

However, the frequency at the resonance point of the first resonator 301p is higher than the frequencies at the resonance points of the second resonators 310p. In other words, a high frequency side in the attenuation band of the second filter 30 is defined by the resonance point of the first resonator 301p. Since the ripple of the first resonator 301p is generated in a higher frequency band than the resonance point of the high frequency side in the attenuation band of the second filter 30, it is generated outside the attenuation band (i.e., outside the pass band of the first filter 10). On the other hand, the anti-resonance points of the second resonators 310p define middle and low frequency sides except for the high frequency side in the attenuation band of the second filter 30. Although the ripples of the second resonators 310p are generated in higher frequency bands than the resonance points of the middle and low frequency sides in the attenuation band of the second filter 30, they are generated in the attenuation band of the second filter 30 (i.e., the pass band of the first filter 10). Therefore, as illustrated in portion (c) of FIG. 7, the ripples of the second resonators 310p are generated in the pass band of the first filter 10, and the ripple of the first resonator 301p is generated outside the pass band of the first filter 10.

When the frequencies at which the ripples of the elastic wave resonators of the second filter 30 are generated and the pass band of the first filter 10 overlap with each other, the ripples may influence the bandpass characteristics in the pass band. In particular, the first resonator 301p is provided at the position closest to the common terminal Port1 among the first resonator 301p and the second resonators 310p, and is thus likely to influence the first filter 10. In other words, the first resonator 301p is directly connected to the first filter 10 with the common terminal Port1 interposed therebetween, so that the first resonator 301p is likely to influence the first filter 10. However, in the present preferred embodiment, since the ripple of the first resonator 301p is generated outside the pass band of the first filter 10, the ripple less influences the bandpass characteristics in the pass band of the first filter 10.

In addition, the first resonator 301p is interposed between the second resonators 310p and the common terminal Port1. Although the ripples of the second resonators 310p are generated in the pass band of the first filter 10, the influences that can be imparted to the first filter 10 by the ripples of the second resonators 310p are attenuated by the attenuation characteristics of the first resonator 301p and hardly appear in the bandpass characteristics of the first filter 10. As in the first preferred embodiment, the attenuation amount at the generation frequencies of the ripples of the second resonators 310p in the bandpass characteristics of the first resonator 301p is larger than the attenuation amount at the generated frequencies in the bandpass characteristics of the second resonators 310p by, for example, equal to or larger than about 10 dB. Thus, the influences that can be imparted to the first filter 10 by the ripples of the second resonators 310p are attenuated by equal to or larger than 10 dB by the attenuation characteristics of the first resonator 301p, and the influences by the ripples of the second resonators 310p hardly appear in the bandpass characteristics of the first filter 10. Therefore, as illustrated in portion (a) of FIG. 7, deterioration in the bandpass characteristics in the pass band of the first filter 10 due to the ripples of the second resonators 310p is reduced or prevented. With this configuration, even if the ripples of the second resonators 310p are generated in the pass band of the first filter 10 due to design, the deterioration in the bandpass characteristics in the pass band of the first filter 10 is able to be reduced or prevented.

Further, as illustrated in portion (b) of FIG. 7, the ripple of the first resonator 301p is generated outside the pass band of the second filter 30. In other words, the ripple of the first resonator 301p is generated only outside the pass band of the first filter 10 and outside the pass band of the second filter 30. Here, the pass band of the second filter 30 (BEF) is a band in which attenuation is not made by the BEF, and is, for example, a band of about equal to or higher than 1.65 GHz in portion (b) of FIG. 7. With this configuration, the deterioration in the bandpass characteristics in the pass band of the second filter 30 is also able to be reduced or prevented.

As described above, in the multiplexer 2 according to the second preferred embodiment, the ripple of the first resonator 301p is generated only outside the pass bands of the first filter 10 and the second filter 30, and the deterioration in the bandpass characteristics in the pass bands of the first filter 10 and the second filter 30 is able to be reduced or prevented. Specifically, in the case where the first resonator 301p and the second resonators 310p are the parallel resonators provided on the parallel arms of the second path and the ripples are generated in higher frequency bands than the frequencies of the resonance points, the deterioration in the bandpass characteristics in the pass bands of the first filter 10 and the second filter 30 is able to be reduced or prevented by increasing the resonant frequency of the first resonator 301p to be the highest among the resonant frequencies of the first resonator 301p and the second resonators 310p.

Similarly, in the case where the first resonator 301p and the second resonators 310p are the parallel resonators provided on the parallel arms of the second path and the ripples are generated in lower frequency bands than the frequencies of the resonance points, the deterioration in the bandpass characteristics in the pass bands of the first filter 10 and the second filter 30 is able to be reduced or prevented by decreasing the resonant frequency of the first resonator 301p to be the lowest among the resonant frequencies of the first resonator 301p and the second resonators 310p.

As in the first preferred embodiment, it is difficult to achieve both an increase in the Q value of the elastic wave resonator and prevention of the ripple of the elastic wave resonator from being generated. Accordingly, in the multiplexer 2 according to the second preferred embodiment, although the ripple of the first resonator 301p is generated, the deterioration in the bandpass characteristics due to the ripple is reduced or prevented by generating the ripple only outside the pass bands of the first filter 10 and the second filter 30.

Third Preferred Embodiment

In the multiplexers according to the first and second preferred embodiments, the resonant frequency of the first resonator is set to be the highest or the lowest among the resonant frequencies of the first resonator and the second resonators, such that the ripple of the first resonator is generated outside the pass bands of the first filter 10 and the second filter and the deterioration in the bandpass characteristics due to the ripple is reduced or prevented. That is to say, in the first and second preferred embodiments, the first resonator generates the ripple. In the present preferred embodiment, deterioration in bandpass characteristic due to a ripple is reduced or prevented by preventing the ripple from being generated in the first resonator.

The circuit configuration of a multiplexer 3 according to a third preferred embodiment of the present invention is the same as the circuit configuration of the multiplexer 1 according to the first preferred embodiment illustrated in FIG. 1. Here, elastic wave resonators corresponding to the first resonator 201s and the second resonators 202s and 203s according to the first preferred embodiment are referred to as a first resonator 501s and second resonators 502s and 503s, respectively. In addition, it is assumed that a magnitude relationship among frequencies at anti-resonance points of the first resonator 501s and the second resonators 502s and 503s is the same as a magnitude relationship among the frequencies at the anti-resonance points of the first resonator 401s and the second resonators 402s and 403s according to the comparative example of the first preferred embodiment illustrated in portion (c) of FIG. 2, for example. In other words, the frequency at the anti-resonance point of the first resonator 501s is higher than the frequency at the anti-resonance point of the second resonator 502s and is lower than the frequency at the anti-resonance point of the second resonator 503s. Further, a second filter including the first resonator 501s and the second resonators 502s and 503s is referred to as a second filter 200.

In this preferred embodiment, the first resonator 501s closest to the common terminal Port1 among the first resonator 501s and the second resonators 502s and 503s generates no ripple in pass bands of the first filter 10 and the second filter 200. Specifically, a design parameter of the first resonator 501s is a parameter that generates no ripple in the first resonator 501s in the pass bands of first resonator 10 and the second filter 200. The design parameter is, for example, at least one of Cut-Angles of a piezoelectric substrate provided with the elastic wave resonator, a film thickness or a material of an IDT electrode of the elastic wave resonator, a film thickness or a material of a protection film provided on the IDT electrode, a film thickness or a material of a dielectric film provided on the IDT electrode, and a duty ratio as a ratio of a line width of a plurality of electrode fingers of the IDT electrode relative to an added value of the line width and a space width of the plurality of electrode fingers. By adjusting at least one of the design parameters to design the first resonator 501s, it is possible to prevent a ripple from being generated in the first resonator 501s in the pass bands of the first filter 10 and the second filter 200.

As described above, it is difficult to achieve both of increase in the Q value of the elastic wave resonator and prevention of the ripple from being generated in the elastic wave resonator, and the Q value becomes low by preventing the ripple from being generated in the first resonator 501s. For example, by preventing the ripple from being generated in the first resonator 501s, impedance characteristics of the first resonator 501s become characteristics that no ripple is generated in the part A illustrated in portion (c) of FIG. 2 but the Q value becomes low and sharpness at an anti-resonance point becomes dull. In other words, attenuation characteristics in an attenuation band of the second filter 200 are deteriorated, and bandpass characteristics in the pass band of the first filter 10, which overlaps with the attenuation band, are deteriorated.

However, since influences by ripples of the second resonators 502s and 503s (also collectively referred to as second resonators 510s) are attenuated by the first resonator 501s, the second resonators 510s may generate the ripples in the pass band of the first filter 10. In other words, instead of generation of the ripples in the pass band of the first filter 10 by the second resonators 510s, Q values of the second resonators 510s are able to be increased. Therefore, although the Q value of the first resonator 501s is low among the first resonator 501s and the second resonators 510s, the Q values of the second resonators 510s are high, thus reducing or preventing deterioration in attenuation characteristics in an attenuation band of overall the second filter 200.

As described above, the first resonator 501s among the first resonator 501s and the second resonators 510s generates no ripple in the pass bands of the first filter 10 and the second filter 200, so that the deterioration in the bandpass characteristics due to the ripple is able to be reduced or prevented.

In addition, design parameters of the second resonators 510s may be substantially the same design parameters as that of the first resonator 501s. This will be described with reference to FIG. 8.

Figure 8:
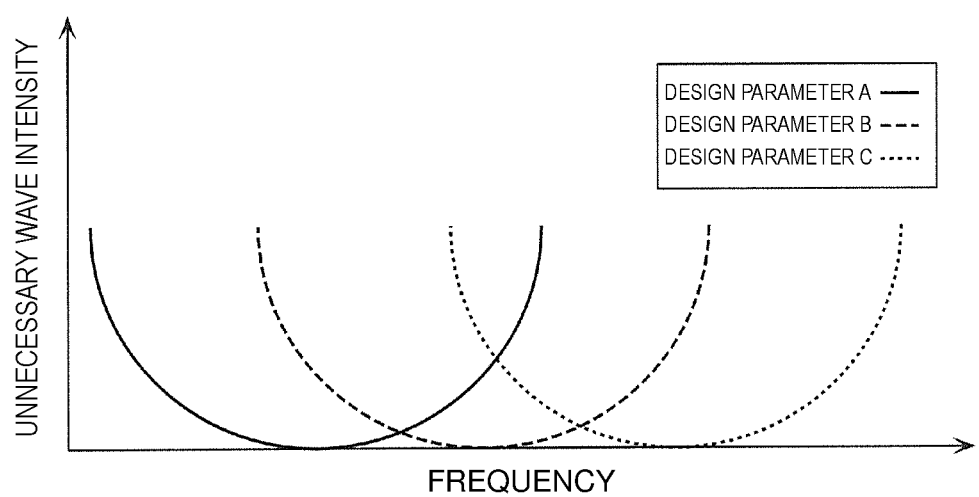
FIG. 8 is a diagram illustrating an example of relationships between a frequency and an unwanted wave intensity in elastic wave resonators formed by design parameters differing from each other.

FIG. 8 is a diagram illustrating an example of relationships between a frequency and an unwanted wave intensity in elastic wave resonators formed based on design parameters differing from each other.

As illustrated in FIG. 8, the frequency at which the unwanted wave intensity becomes substantially 0 is different depending on the design parameters. In other words, it is possible to prevent a ripple from being generated in the elastic wave resonator in accordance with the design parameter.

The design parameter of the first resonator 501s is set to a design parameter (e.g., design parameter B) which generates no ripple in the first resonator 501s in the pass bands of the first filter 10 and the second filter 200. Further, the design parameters of the second resonators 510s are also set to the design parameter B. The design parameter B is such a design parameter that the Q values of the second resonators 510S are increased. The frequencies at the resonance points and the anti-resonance points of the second resonators 510S are different from those of the first resonator 501s. Therefore, when the design parameters of the second resonators 510s are the design parameter B, the second resonators 510s generate ripples. As described above, since the influences by the ripples of the second resonators 510s are attenuated by the first resonator 501s, the second resonators 510s may generate the ripples. Accordingly, the design parameters of the second resonators 510s can be made the same as the design parameter of the first resonator 501s (such a design parameter that the second resonators 510s generate the ripples). Thus, by making the design parameters of the first resonator 501s and the second resonators 510s substantially the same, it is easy to form the first resonator 501s and the second resonators 510s on the same chip to reduce the size of the multiplexer.

Fourth Preferred Embodiment

One of the multiplexers according to preferred embodiments of the present invention is able to be applied to a high-frequency front-end circuit and a communication apparatus. In a fourth preferred embodiment of the present invention, a high-frequency front-end circuit 80 including the multiplexer 1 and a communication apparatus 100 including the high-frequency front-end circuit 80 will be described.

Figure 9:
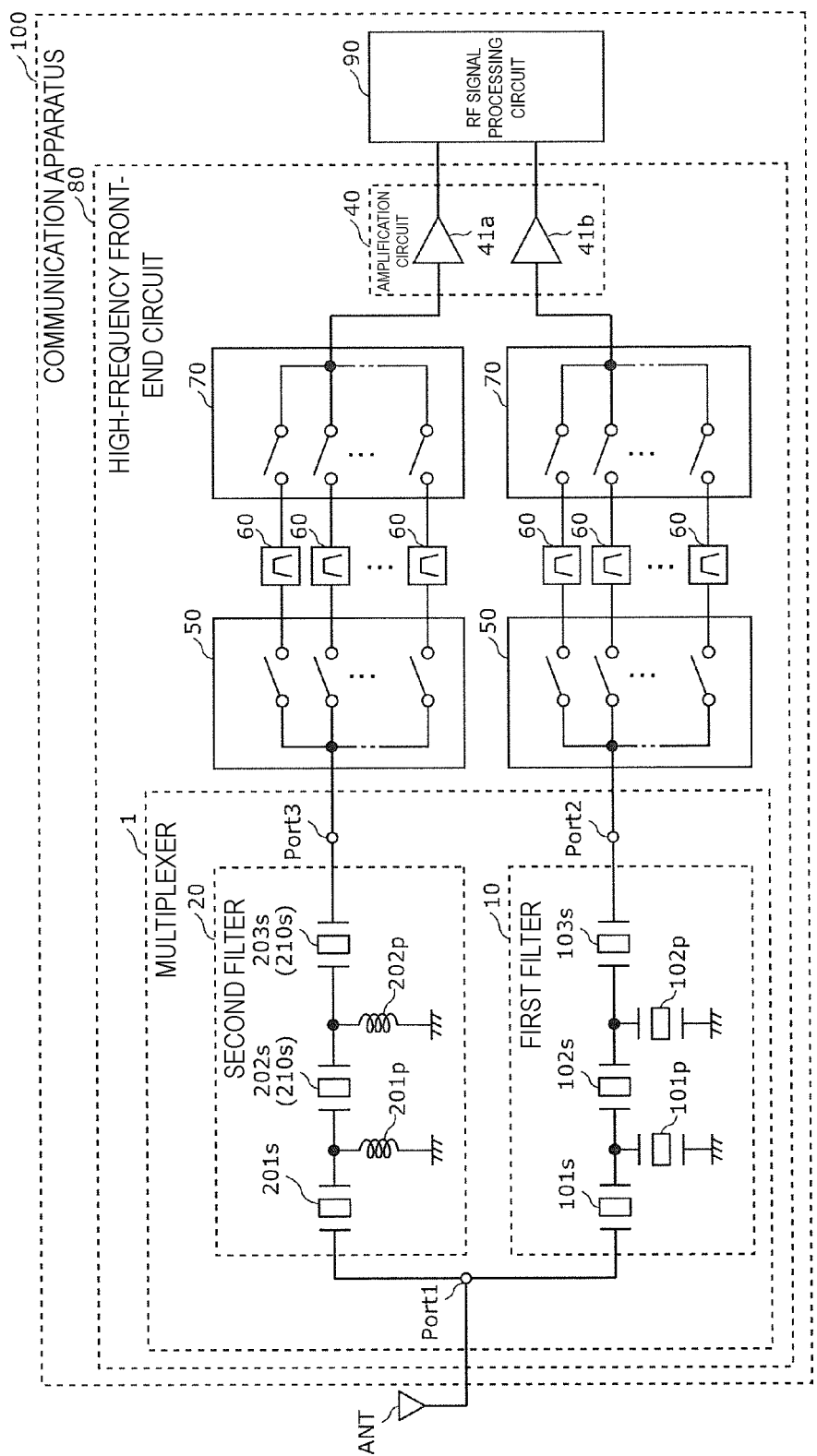
FIG. 9 is a configuration diagram illustrating an example of a communication apparatus according to a fourth preferred embodiment of the present invention.

FIG. 9 is a configuration diagram illustrating an example of the communication apparatus 100 according to the fourth preferred embodiment. FIG. 9 illustrates the antenna element ANT as well, which is connected to the common terminal Port1 of the multiplexer 1.

The communication apparatus 100 includes the high-frequency front-end circuit 80 and an RFIC (RF signal processing circuit) 90.

The high-frequency front-end circuit 80 transmits a high frequency signal that is transmitted and received by the antenna element ANT between the antenna element ANT and the RF signal processing circuit 90. In this preferred embodiment, the high-frequency front-end circuit 80 transmits a reception signal that is received by the antenna element ANT between the antenna element ANT and the RF signal processing circuit 90. The high-frequency front-end circuit 80 includes the multiplexer 1, switch circuits 50, BPFs 60, switch circuits 70, and an amplification circuit 40 connected to the multiplexer 1 with the switch circuits 50, the BPFs 60, and the switch circuits 70 interposed therebetween. Note that since the multiplexer 1 is the same as that in the first preferred embodiment, description thereof will be omitted.

The BPFs 60 are filters having different pass bands, and transmit signals of desired frequency bands. Note that each of the BPFs 60 may be an HPF, an LPF, a BEF, or the like.

Each of the switch circuits 50 is a switch circuit including a common terminal connected to the filter (the first filter 10 or the second filter 20) included in the multiplexer 1 and a plurality of selection terminals connected to the BPFs 60. Each of the switch circuits 70 is a switch circuit including a plurality of selection terminals connected to the BPFs 60 and a common terminal connected to the amplification circuit 40. By connecting the common terminal of the switch circuit 50 and the selection terminal thereof connected to the specific BPF 60 and connecting the common terminal of the switch circuit 70 and the selection terminal thereof connected to the specific BPF 60, a signal of a further desired frequency band in a frequency band filtered by the first filter 10 or the second filter 20 is able to be transmitted to the RF signal processing circuit 90, which will be described later.

The amplifier circuit 40 includes low noise amplifiers (also referred to as "LNAs") 41a and 41b. The LNAs 41a and 41b are reception amplification circuits which amplify the reception signal and output the amplified reception signal to the RF signal processing circuit 90. The amplification circuit 40 may include a power amplifier as a transmission amplification circuit which amplifies and outputs a transmission signal from the RF signal processing circuit 90.

The RF signal processing circuit 90 is a circuit to process the reception signal and the transmission signal that are transmitted and received by the antenna element ANT. The RF signal processing circuit 90 performs signal processing on the received signal input from the antenna element ANT after passing through the high-frequency front-end circuit 80 by down conversion or the like, and outputs a received signal generated by the signal processing to a baseband signal processing circuit (not illustrated). Further, the RF signal processing circuit 90 performs signal processing on the transmission signal input from the baseband signal processing circuit by up conversion or the like, and outputs a transmission signal generated by the signal processing to the antenna element ANT.

As described above, the multiplexers of preferred embodiments of the present invention may be applied to the high-frequency front-end circuit 80 and the communication apparatus 100.

OTHER PREFERRED EMBODIMENTS

While the multiplexers, the high-frequency front-end circuits, and the communication apparatuses according to each of the preferred embodiments have been described above, the present invention is not limited to the above-described preferred embodiments.

For example, in each of the above preferred embodiments, the multiplexer includes two filters (the first filter 10 and the second filter). The multiplexer is however not limited thereto and may include equal to or more than three filters.

Further, for example, in each of the above preferred embodiments, the first filter 10 is the BPF. The first filter 10 is however not limited thereto and may be an LPF or an HPF.

Further, for example, in each of the above preferred embodiments, the number of series resonators and the number of parallel resonators of the first filter 10 are three and two, respectively. The numbers thereof are however not limited thereto and it is sufficient that at least one series resonator and at least one parallel resonator are provided. In other words, it is sufficient that the first filter 10 has a ladder filter structure of at least one stage. In addition, an impedance element such as an inductor, a capacitor, and the like may be inserted or connected on the series arm or the parallel arm of the first filter 10.

Further, for example, in each of the above preferred embodiments, the first filter 10 includes the elastic wave resonators. The first filter 10 is however not limited thereto and may include an LC resonance circuit.

Further, for example, in each of the above preferred embodiments, the second filter includes the SAW resonators. The second filter is however not limited to including the SAW resonators and may include BAW resonators or FBAR resonators.

Further, for example, in the first preferred embodiment, the number of series resonators and the number of parallel inductors in the second filter 20 are three and two, respectively. The numbers thereof are however not limited thereto. For example, it is sufficient that at least one series resonator is provided. In addition, the number of parallel inductors may be zero, one, or equal to or more than three, for example. In addition, the parallel inductors may be impedance elements such as parallel capacitors.

In addition, for example, in the second preferred embodiment, the number of parallel resonators and the number of series inductors in the second filter 30 are three. The numbers thereof are however not limited thereto. It is sufficient that at least one parallel resonator is provided, for example. Further, for example, zero to two or equal to or more than four series inductors may be provided. In addition, the series inductors may be impedance elements such as series capacitors.

Further, for example, although the first resonator 501s and the second resonators 510s are the series resonators in the third preferred embodiment. They are however not limited to the series resonators and may be parallel resonators. Even in this case, deterioration in the bandpass characteristics due to the ripple is able to be reduced or prevented by preventing the ripple from being generated in the first resonator in the pass bands of the first filter 10 and the second filter.

Further, for example, the high-frequency front-end circuit 80 includes the multiplexer 1 in fourth preferred embodiment. The high-frequency front-end circuit 80 is however not limited to include the multiplexer 1, and may include the multiplexer 2, the multiplexer according to the third preferred embodiment, or the like.

In addition, example structures and configurations obtained by applying, to the preferred embodiments, various variations that those skilled in the art contemplate, and example structures and configurations realized by arbitrarily combining the components and the functions in the preferred embodiments in a range without departing from the spirit of the present invention are also included in the present invention.

Preferred embodiments of the present invention are widely applicable to communication apparatuses such as a cellular phone as the multiplexers, the high-frequency front-end circuits, and the communication apparatuses that reduce or prevent deterioration in the bandpass characteristics due to a ripple.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a first filter that is provided on a first path connecting a common terminal and a first terminal and is any one of a band pass filter, a low pass filter, and a high pass filter; and
   a second filter that is provided on a second path connecting the common terminal and a second terminal and is a band elimination filter including at least one elastic wave resonator; wherein
   a pass band of the first filter and an attenuation band of the second filter overlap with each other; and
   a ripple of a first resonator located at a position closest to the common terminal among the at least one elastic wave resonator is generated only outside pass bands of the first filter and the second filter.

2. The multiplexer according to claim 1, wherein the at least one elastic wave resonator includes a plurality of elastic wave resonators including the first resonator and a second resonator.

3. The multiplexer according to claim 2, wherein a ripple of the second resonator is generated in the pass band of the first filter.

4. The multiplexer according to claim 2, wherein the first resonator and the second resonator are series resonators provided on the second path.

5. The multiplexer according to claim 2, wherein the first resonator and the second resonator are parallel resonators provided on paths connecting the second path and ground.

6. The multiplexer according to claim 2, wherein an attenuation pole of the first resonator is located at a lower frequency side than an attenuation pole of the second resonator.

7. The multiplexer according to claim 2, wherein an attenuation pole of the first resonator is located at a higher frequency side than an attenuation pole of the second resonator.

8. The multiplexer according to claim 2, wherein an attenuation amount at a generation frequency of a ripple of the second resonator in a bandpass characteristic of the first resonator is larger than an attenuation amount at the generation frequency in a bandpass characteristic of the second resonator by equal to or larger than about 10 dB.

9. The multiplexer according to claim 2, wherein a fractional bandwidth of the attenuation band of the second filter is equal to or higher than about 3%.

10. A high-frequency front-end circuit comprising:
the multiplexer according to claim 1; and
an amplification circuit connected to the multiplexer.

11. A communication apparatus comprising:
an RF signal processing circuit that processes a high frequency signal transmitted and received by an antenna element; and
the high-frequency front-end circuit according to claim 10 that transmits the high frequency signal between the antenna element and the RF signal processing circuit.

12. A multiplexer comprising:
a first filter that is provided on a first path connecting a common terminal and a first terminal and is any one of a band pass filter, a low pass filter, and a high pass filter; and
a second filter that is provided on a second path connecting the common terminal and a second terminal and is a band elimination filter including a plurality of elastic wave resonators including a first resonator and a second resonator;
wherein
a pass band of the first filter and an attenuation band of the second filter overlap with each other;
the first resonator of the plurality of elastic wave resonators is located at a position closest to the common terminal; and
the first resonator generates no ripple in pass bands of the first filter and the second filter.

13. The multiplexer according to claim 12, wherein the second resonator generates a ripple in the pass band of the first filter.

14. The multiplexer according to claim 12, wherein a design parameter of the first resonator is a parameter that generates no ripple in the first resonator in the pass bands of the first filter and the second filter.

15. The multiplexer according to claim 14, wherein the design parameter is at least one of cut-angles of a piezoelectric substrate provided with an elastic wave resonator, a film thickness or a material of an IDT electrode of the elastic wave resonator, a film thickness or a material of a protection film provided on the IDT electrode, a film thickness or a material of a dielectric film provided on the IDT electrode, and a duty ratio defining a ratio of a line width of a plurality of electrode fingers of the IDT electrode relative to an added value of the line width and a space width of the plurality of electrode fingers.

16. The multiplexer according to claim 14, wherein a design parameter of the second resonator is the same or substantially the same as the design parameter of the first resonator.

17. A high-frequency front-end circuit comprising:
the multiplexer according to claim 12; and
an amplification circuit connected to the multiplexer.

18. A communication apparatus comprising:
an RF signal processing circuit that processes a high frequency signal transmitted and received by an antenna element; and
the high-frequency front-end circuit according to claim 17 that transmits the high frequency signal between the antenna element and the RF signal processing circuit.

* * * * *